United States Patent [19]

Kohm

[11] Patent Number: 5,338,567
[45] Date of Patent: Aug. 16, 1994

[54] PRINTED CIRCUITS AND BASE MATERIALS PRECATALYZED FOR METAL DEPOSITION

[75] Inventor: Thomas S. Kohm, Huntington, N.Y.

[73] Assignee: AMP-AKZO Corporation, Newark, Del.

[21] Appl. No.: 979,481

[22] Filed: Nov. 20, 1992

Related U.S. Application Data

[63] Continuation of Ser. No. 698,851, May 13, 1991, abandoned, which is a continuation-in-part of Ser. No. 534,959, Jun. 8, 1990, abandoned.

[51] Int. Cl.⁵ .............................................. C23C 26/00
[52] U.S. Cl. ............................................ 427/98; 427/97
[58] Field of Search ..................................... 427/97, 98

[56] References Cited

U.S. PATENT DOCUMENTS

| | | | |
|---|---|---|---|
| 3,226,256 | 12/1965 | Schneble | 427/98 |
| 3,546,009 | 12/1970 | Schneble, Jr. et al. | 106/128 |
| 3,546,011 | 12/1970 | Knorre et al. | 427/98 |
| 3,560,257 | 2/1971 | Schneble, Jr. et al. | 427/98 |
| 3,600,330 | 8/1971 | Schneble, Jr. et al. | 106/112 |
| 3,620,933 | 11/1971 | Grunwald | 427/97 |
| 3,628,999 | 12/1971 | Schneble | 427/98 |
| 3,629,185 | 12/1971 | Schneble, Jr. et al. | 524/403 |
| 4,167,601 | 9/1979 | Beckenbaugh et al. | 427/97 |
| 4,239,813 | 12/1980 | Murakami | 427/98 |
| 4,287,253 | 9/1981 | Leech | 427/306 |
| 4,564,424 | 1/1986 | Cassat | 428/626 |
| 4,565,606 | 1/1986 | Cassat | 428/626 |
| 4,639,380 | 1/1987 | Amelio | 427/98 |
| 4,759,952 | 7/1988 | Brasch | 427/98 |
| 4,791,248 | 12/1988 | Oldenettel | 427/97 |
| 4,800,461 | 1/1989 | Dixon | 427/97 |
| 4,913,768 | 4/1990 | Wolf | 427/98 |

FOREIGN PATENT DOCUMENTS

| | | |
|---|---|---|
| 199643 | 12/1982 | Japan . |
| 7044 | 1/1984 | Japan . |
| 97633 | 4/1989 | Japan . |
| 222950 | 9/1989 | Japan . |
| 117912 | 5/1990 | Japan . |
| 133436 | 5/1990 | Japan . |
| 133437 | 5/1990 | Japan . |
| 133438 | 5/1990 | Japan . |
| 133439 | 5/1990 | Japan . |
| 133440 | 5/1990 | Japan . |
| 133441 | 5/1990 | Japan . |
| 133442 | 5/1990 | Japan . |
| 133443 | 5/1990 | Japan . |
| 133444 | 5/1990 | Japan . |

*Primary Examiner*—Shrive Beck
*Assistant Examiner*—Vi Duong Dang
*Attorney, Agent, or Firm*—Morgan & Finnegan

[57] ABSTRACT

This invention concerns a method of manufacturing printed wiring boards by electrolessly plating copper on a precatalyzed base material which contains a polymeric resin, woven glass cloth reinforcement and a noble metal catalyst on clay support to precatalyze the base material for electrolessly depositing copper. The improvement comprises providing in the polymeric resin, a phenolic resin component and a silicate filler. The silicate filler is present in an amount between 30 and 100 part per hundred parts of the polymeric resin, and in an amount sufficient to provide a take time for the initiation of electroless copper deposition at least two times faster than a comparable precatalyzed base material without the silicate filler and phenolic resin.

8 Claims, No Drawings

PRINTED CIRCUITS AND BASE MATERIALS PRECATALYZED FOR METAL DEPOSITION this is a continuation of co-pending application Ser. No. 07/698,851, filed on May 13, 1991 now abandoned. which is a continuation-in-part of U.S. patent application Ser. No. 07/534,959 filed Jun. 8, 1990 now abandoned.

FIELD OF THE INVENTION

This invention relates to printed wiring board base materials which are catalytic for metal deposition, methods for their manufacture, and their use in the manufacture of printed wiring boards.

BACKGROUND OF THE INVENTION

Printed wiring boards are manufactured by subtractive and by additive processes. In subtractive processes, the conductive pattern is obtained by selective removal of unwanted portions of a conductive foil. In fully-additive processes, the entire thickness of electrically isolated conductors is built up by electroless metal deposition.

Schneble, Jr. et al., U.S. Pat. No. 3,226,256 and Cassat et al., U.S. Pat. Nos. 4,564,424 and 4,565,606 disclosed precatalyzed polymeric base materials containing cuprous oxide as an electroless plating catalyst for use as base materials in fully-additive printed wiring boards. Cuprous oxide is a semiconductor, and precatalyzed base materials containing cuprous oxide developed high leakage currents in use, especially when operating temperatures exceeded 50° C. For this reason, the cuprous oxide precatalyzed base materials are no longer used.

Schneble, Jr. et al, U.S. Pat. Nos. 3,546,009, 3,600,330 and 3,629,185 taught insulating base materials catalytic for electroless metal deposition incorporating filler particles having a metal or metal cation of Group I-B or Group VII metals on the particles. These insulating base materials have been used in the manufacture of printed wiring boards by fully-additive processes, but they have not been accepted in the subtractive processes because the "take time" for the initiation of an electroless copper deposit was too long. Base materials are manufactured for fully-additive processes which contain a catalyst for electroless metal deposition supported on a clay filler. The FR-4 type, additive base material contains 12 parts of palladium catalyzed clay filler per hundred parts of epoxy resin.

Among the thermosetting polymers used as printed wiring base materials are phenolic, epoxy, polyimide, cyanate ester and bismaleimide triazine resins. Woven fiber reinforcements such as glass cloth, woven aramid fibers and woven quartz fibers are used in printed wiring boards.

Silane coupling agents and oganosilicon chemicals are used to upgrade the physical and electrical properties of mineral and glass filled thermoplastic resin systems to values approaching or sometimes exceeding the unfilled resin. In thermosetting resins, silane coupling agents are applied to the woven glass cloth in FR-4 laminates to improve the bond between the epoxy resin and the woven glass cloth. Silane coupling agents have also been used on alumina trihydrate in epoxy molding compounds to improve the electrical properties of the molded part. However silane coupling agents are subject to hydrolysis and are not suitable for base materials which during printed wiring board processing will be subjected to prolonged exposure to alkaline solutions.

Titanate and zirconate coupling agents react with an inorganic filler to make it hydrophobic, organophilic and organofunctional. In thermoplastic systems, filled polymers containing titanate and zirconate treated fillers have lower melt viscosity and are more easily processed than filled polymers without coupling agents. In thermosetting epoxy moldings filled with milled aramid, moldings treated with titanate coupling agents had triple the flexural and impact strength compared to moldings without coupling agents. Likewise, epoxy systems filled with potassium titanate whiskers had improved impact strength when titanate coupling agents were used. However the use of organotitanate and organozirconate coupling agents has not gained acceptance in printed wiring board base materials.

SUMMARY OF THE INVENTION

Objects of the Invention

An object of this invention is to provide an improved polymeric base material which is catalytic for copper deposition.

It is also an object of this invention to provide a method of producing base materials for printed wiring boards catalytic for electroless deposition and having a coefficient of thermal expansion along the Z-axis less than $140 \times 10^{-6}/°C$.

It also is an object of this invention to provide a method of producing fully additive printed wiring boards with greater resistance to thermal stress and thermal cycling than was available in similar, prior art, printed wiring boards.

A further object of this invention is to produce base materials for the manufacture of fully-additive, printed wiring boards which base materials have enhanced catalytic activity for electroless metal deposition.

A further object of this invention is to produce base materials for the manufacture of subtractive printed wiring boards which are pre-catalyzed for electroless metal deposition and have enhanced catalytic activity compared to prior art base materials.

Yet another object of this invention is to produce a base material for printed wiring boards which has low water absorption, and is resistant to attack by alkaline solutions such as alkaline, electroless, copper deposition solutions.

It is an additional object of this invention to provide printed wiring boards in which the walls of the plated-through holes will not crack when subjected to thermal stress.

Definitions

By phenolic resin is meant a polymer formed by the condensation of phenol, alkyl phenols, cresols, xylenols with aldehydes including formaldehyde, furfuraldehyde. The phenolic resin includes condensation polymers of mixtures of the foregoing materials and also mixtures with methylolmelamines, catechol, resorcinol, hydroxyanisole, naphthols, dihydroxylnapthols and nitrophenols.

By an aromatic moiety having a hydroxyl substituent is meant an aromatic ring with a hydroxyl group attached to the ring. A phenol formaldehyde polymer having 10 phenol groups has, by this definition, ten aromatic moieties with hydroxyl substituents.

By elongation is meant the elongation of a copper deposit when measured by the IPC Test Method 2.4.18, "Tensile Strength and Elongation, Copper Foil", available from The Institute For Interconnecting And Packaging Electronic Circuits.

By a CTE of ... ppm is meant a coefficient of thermal expansion of ... $\times 10^{-6}$/°C.

By average CTE between 30° C. and 270° C. along the Z-axis is meant the change in thickness of a base material from 30° C. to 270° C. divided by the thickness of the base material at 30° C. Since most base materials pass through a glass transition point below the midpoint, 150° C., the average CTE between 30° C. and 270° C. is slightly smaller than the arithmetical average of the CTE below the glass transition point and the CTE above it.

By milliequivalent of aromatic hydroxyl is meant the weight of a substance that contains $6.02 \times 10^{20}$ (0.001×Avogadro's Number) of aromatic rings which have a hydroxyl group on the ring.

By soldering temperature is meant the temperature at which discrete components are mass soldered to a printed wiring board. Soldering temperatures normally range from 220° to 300° C.

By thermal stress is meant the stress applied to a plated-through hole by exposing a printed wiring board to molten solder at 288° C. for 10 seconds.

By thermal stress test is meant the test described in ANSI/IPC-SD-320B, "Performance Specification For Rigid Single- and Double-Sided Printed Boards", paragraph 4.6.5.1, Table 27, Class 3. In this test, printed wiring boards are conditioned by drying for six hours to remove moisture, then a thermal stress is applied and the plated- through holes are microsectioned and examined for cracks. Passing the thermal stress test means no cracks are found in the holes.

By thermal cycling test is meant cycling a printed wiring board having plated-through holes from $-65°$ C. to 125° C. and remaining thirty minutes at each temperature. Passing the thermal cycling test means that there was no substantial change in the resistance of a series of plated-through holes during 300 cycles.

By parts per hundred resin (phr) is meant a concentration of an ingredient in a base material wherein the weight of the ingredient is based on the total weight of polymer solids in the base material.

For a printed wiring board base material having a planar shape and a length and breath greatly exceeding its thickness, X- and Y-axes refer to the planar dimensions, length and breath, and properties associated with those dimensions. Z-axis refers to the dimension and properties of the base material which are perpendicular to its planar dimensions and properties which are associated with the thickness of the base material.

Expansion along the Z-axis and CTE along the Z-axis of a base material refer to an increase in the thickness of the base material and the linear coefficient of thermal expansion in the direction perpendicular to the planar dimensions of the base material.

BRIEF DESCRIPTION OF THE INVENTION

In one aspect, this invention concerns a polymeric base material which is catalytic for metal deposition, the base material comprising a first catalyst comprising a particulate silicate filler dispersed in the polymeric base material and an aromatic moiety having a hydroxyl substituent dissolved in or attached to the polymers of the polymeric base material.

In another aspect, this invention is concerned with a polymeric base material having a first catalyst comprising a particulate silicate filler and an aromatic moiety having a hydroxyl substituent in the polymeric base material and further comprising a second catalyst for metal deposition, said second catalyst being selected from the group consisting of palladium, platinum, ruthenium, iridium, rhodium, silver or gold and compounds and mixtures thereof dissolved or dispersed in the polymeric base material.

Another aspect of the invention concerns an improved base material for printed wiring boards. The base material is a laminate comprised of a plurality of glass cloth layers impregnated with a varnish. The impregnating varnish comprises an epoxy resin, a silicate filler, an organotitanate and/or an organozirconate coupling agent, and a curing agent for the epoxy resin, the curing agent capable of producing a cured base material capable of accepting electroless metal deposits free of voids caused by interaction of the curing agent with palladium catalysts for electroless deposition, said curing agent being selected from the group consisting of phenolic resins and aromatic compounds having at least one hydroxyl group on the aromatic ring and mixtures of such curing agents.

In another aspect, the invention comprises a base material for printed wiring boards having improved catalytic activity for electroless metal deposition. The base material comprising a polymeric resin composition having phenolic hydroxyl groups and at least 30% by weight of an inorganic silicate filler.

In yet another aspect, the invention comprises printed wiring boards having plated-through holes produced on the above base materials.

DETAILED DESCRIPTION OF THE INVENTION

The present invention concerns a polymeric base material catalytic for copper deposition comprising a first catalyst comprising in combination a particulate silicate filler dispersed in the polymeric base material and an aromatic moiety having a hydroxyl substituent dissolved in or attached to the polymers of the polymeric base material. Optionally, the polymeric base material may further comprise a second catalyst for copper deposition, the second catalyst being selected from the group consisting of palladium, platinum, ruthenium, iridium, rhodium, silver or gold and compounds and mixtures thereof. The second catalyst may be present in the polymeric base material as 0.0005 to 0.05 parts by weight as metal per hundred parts polymeric resin in the base material, and preferably may be present in the base material as 0.001 to 0.005 parts by weight as metal per hundred parts polymeric resin in the base material.

The aromatic moiety having a hydroxyl substituent is present in the base material in the range of 0.01–10 milliequivalents of aromatic hydroxyl per gram of particulate filler, preferably in the range of 0.1–5 milliequivalents of aromatic hydroxyl per gram of particulate filler and most preferably in the range of 0.5–2 milliequivalents of aromatic hydroxyl per gram of particulate filler.

When the base material comprises an epoxy resin, the aromatic moiety having a hydroxyl substituent is preferably selected from the groups consisting of polymers and copolymers preferably containing phenols, cresols, xylenols, alkyl phenols, catechol, resorcinol and hydroxyanisole, naphthols, dihydroxylnapthols and nitrophenol compounds, the polymers or copolymers having at least three hydroxyl substituted aromatic rings in a molecule, and polymers and mixtures of the foregoing.

The present invention relates to a woven fiber reinforced, plastic, base material and methods of using it in the manufacture of printed wiring boards. When printed wiring boards having plated-through holes are formed on the base material of this invention, the plated-through holes are resistant to failure in thermal stress and thermal cycling.

According to this invention, the amount of particulate filler added to the plastic base material is from 30 to 100 parts filler per 100 parts of the polymers in the base material, preferably from 40 to 80 parts filler per hundred parts of polymers. The filler should be thermally and chemically stable, nonconductive electrically and preferably non-hygroscopic and non-toxic. Toxic fillers are those having an eight hour time weighted average limit for human exposure greater than 1 mg/m$^3$. Fillers preferably have a Moh hardness less than 7. Fillers having a Moh hardness greater than 7 are not useful in the practice of this invention because they cause excessive wear of drills and other tools used in the manufacture of printed wiring boards. Preferably the fillers will have a Moh hardness less than 5.

Suitable fillers include silicates such as calcium silicate (wollastonite), zirconium silicate, aluminum silicates and clays (feldspars, kaolin, micas, nepheline (Na$_3$KAl$_4$Si$_4$O$_{16}$), talc, zeolites). Many other suitable fillers will be obvious to those skilled in the art. Surprisingly, it has been found that for printed wiring boards having plated-through holes formed on the base material of this invention, silicate fillers, especially kaolin and wollastonite provide a superior surface on the hole walls for copper deposition The fillers may be dispersed into an impregnating varnish which is used to impregnate woven reinforcements with a polymeric resin. The impregnating varnish is a solution of thermosetting polymer precursors in solvents. Typical varnishes for impregnating glass cloth are epoxy resin solutions in acetone, methyl ethyl ketone or methyl ethyl ketone/acetone blends.

The particle size of the filler and particle size distribution are selected so that the filler particles are readily dispersed into the interstices of the woven glass reinforcement. The average particle size of the filler should be 0.1 micrometers to 25 micrometers, preferably from 0.3 micrometers to 15 micrometers and more preferably from 1 to 7 micrometers. The filler surface area should at least 150 sq. meters/100 grams of the solid resin composition (including filler), and preferably between 300 and 500 sq. meters/100 grams.

The glass cloth, woven aramid and woven quartz reinforcements ordinarily used in the manufacture of printed wiring board base materials are suitable for use in the base material of this invention. As in conventional printed wiring board base materials, the glass cloth is 45% to 65% by weight of the finished base material.

In the preparation of the impregnating varnish, the filler material is first wetted with solvent and then the resin solution is added to the wetted filler. Coupling agents may be added during the mixing of the varnish. According to a preferred embodiment of this invention, the filler is first wetted with coupling agents dissolved in the solvent. The solvent for the coupling agents may be the same solvent used to dissolve the impregnating resin and adjust the impregnating varnish viscosity. Acetone, methyl ethyl ketone or a mixture of acetone and methyl ethyl ketone may be used.

The coupling agents are selected to improve the bonding between the constituents parts and also for stability. It has been found that printed wiring boards on base materials containing titanate or zirconate coupling agents are more resistant to thermal cycling failure than when silane coupling agents are used. It also has been found that silane coupling agents are attacked by alkaline solutions such as electroless copper deposition solutions more rapidly than organotitanate and organozirconate coupling agents. Since fully additive processing requires prolonged immersion in electroless copper deposition solutions, titanate and zirconate coupling agents are preferred in base materials for fully-additive printed wiring boards.

The insulation value of the base material between plated-through holes is reduced if copper plating on the hole walls intrudes into the base material by plating along the glass fibers. It now has been found that the intrusion of copper deposits from the hole walls into the base material along the glass fibers is substantially reduced when suitable titanate or zirconate coupling agents are used.

The coupling agent should not cause partial polymerization of the resin solution. For epoxy resin varnishes, the preferred coupling agents will not contain reactive amine groups.

The selection of the coupling agent will depend on the filler used. Suitable coupling agents are available from E. I. DuPont de Nemours and Co., Inc., Ajinomoto Co., Inc and Kenrich Petrochemicals Inc. Kenrich Petrochemicals Inc. of Bayonne, N.J., USA manufactures many suitable coupling agents. When wollastonite is used as the filler, suitable Kenrich coupling agents are KZ 55 TM (tetrakis[2,2-bis[(2-propenyloxy)methyl]-1-butanolato-O'] -bis(ditridecylphosph ito- O") dihydrogen zirconate), KR 55 TM (dihydrogen tetrakis[2,2- bis[(2-propenyloxy)-methyl]-1-butanolato-O']bis(ditri-decylphosphito-O") titanate), LICA 97 TM (tris(3-aminophenolato-[(2,2-bis[(2-propenyloxy)methyl]-1-butanolato-O,O',O"]titanium), KR 41B TM (tetra isopropyl-di(dioctylphosphito)titanate), or KR 46B TM (tetraoctyl-di(ditridecylphosphito)titanate).

Suitable coupling agents for a zirconium silicate filler include KZ 55 TM and KZ TPP TM (cyclo[dineopentyl(diallyl)]pyrophosphato dineopentyl (diallyl) zirconate).

KZ 55 TM or LICA 12 TM (tris[bis(2-ethylhexyl)-phosphato-)"][2,2-bis[(2-propenyloxy)methyl]-1-butanolato-O,O',O"]titanium) are suitable coupling agents for kaolin fillers.

Low quartz silica fillers and nephaline feldspar fillers are used with KZ 55 TM or LICA 38 TM (trihydrogen[P,P-bis(2-ethyl-hexyl)diphosphato(2-)-O]bis[P,P-bis(2-ethylhexyl)-diphosphato(2-)-O',O"]-[2,2-bis[-(2-propenyloxy)-methyl]-1-butanolato-O1] titanate) as coupling agents. A suitable coupling agent for fumed silica is KZ TPP TM .

A coupling agent that may be used with a calcined talc filler is KR 38S TM (isopropyltri(dioctyl)-pyrophosphato titanate). Suitable coupling agents for suzorite mica, KZ TPP TM , KZ 55 TM and LICA 12 TM .

The combination of a non-hygroscopic reinforcing filler and a suitable coupling agent surprisingly improves the insulation resistance and lowers the water absorption of the resulting base material. The thermal stress test, as described in ANSI/IPC SD 320 B, excludes water absorption effects by a six hour oven dry before exposing the base material to molten solder at 288° C. In most production facilities, such a long drying cycle is not feasible and water absorption by a printed circuit base material may cause stress failures during soldering of printed circuits.

The copper forming the walls of the plated-through hole must have certain minimum physical properties, elastic modulus, tensile strength, elastic limit or yield point and elongation in order to form a reliable plated-through hole which will not fail the IPC (The Institute for Interconnecting and Packaging Electronic Circuits) or MIL-P-55110D thermal stress tests. The physical properties required in the copper are related to the CTE of the base material. The copper deposited on the hole wall should have a tensile strength of at least 220 MPa.

In epoxy glass laminates, for the more conventional bisphenol A epoxy resins, the preferred curing agent has been dicyandiamide when a copper clad base material is being prepared for printed wiring boards manufactured by a subtractive process because dicyandiamide cured bisphenol A epoxy resins have enhanced adhesion to copper foil compared to resins cured with alternative curing agents.

Surprisingly, it now has been found that the initiation of electroless copper deposits is slower on dicyandiamide cured epoxy base materials than on epoxy base materials cured with phenolic resins. Curing agents containing a plurality of phenolic hydroxyl groups such as novolac or resole phenolic resins are preferred. Curing agents with a plurality of phenolic hydroxyl groups are especially preferred in those base materials used in the manufacture of fully-additive printed wiring boards and most preferred in combination with silicate fillers. It also has been found that the catalytic activity for electroless copper plating is greatly improved when the plastic base material contains at least 3% phenolic resin and 15% to 75% of a particulate silicate compound. Most surprisingly, it has been found that nonmetallic surfaces having silicate fillers in the presence of phenolic resins will catalyze electroless deposition without conventional electroless deposition catalysts such as palladium.

EXAMPLE 1

Calcium silicate (wollastonite) dispersed in polyvinylbutyral-phenolic resin demonstrates the remarkable ability of silicate fillers in the presence of phenolic resins to catalyze electroless copper plating.

An epoxy-glass laminate panel was prepared with seven strips of polyvinylbutyral-phenolic resin compositions on it. Each strip had a composition with a different concentration of wollastonite and other additives. The polyvinylbutyral-phenolic resin composition was 44% polyvinylbutyral and 56% of a trifunctional phenolic resin which had been reacted together in a kettle. The resin/silicate mixtures shown below were deposited on the panel as solutions in 2-(2-butoxyethoxy) ethanol and then baked to drive off solvent and fully cure the resin system.

| Strip | Resin | Wollastonite | Other # Components |
|---|---|---|---|
| 1 | 100% | 0% | — |
| 2 | 60% | 40% | — |
| 3 | 43% | 57% | — |

-continued

| Strip | Resin | Wollastonite | Other # Components |
|---|---|---|---|
| 4 | 33% | 67% | — |
| 5 | 27% | 73% | — |
| 6 | 27% | 71% | 2.3% LICA 97 TM* |
| 7 | 25% | 68% | 2.3% LICA 97 TM 4.5% PEC-8 TM** |

*LICA 97 TM is tris(3-aminophenolato-[(2,2-bis[(2-propenyloxy)methyl]-1-butanolato-O,O',O"]titanium.
**PEC-8 TM is 1% palladium in a bisphenol A epoxy resin solution.

The panel was immersed in an electroless copper deposition bath without adhesion promotion. In less than a minute Strip #5, which had 1.2 milliequivalents of aromatic hydroxyl per gram of silicate filler, was completely covered with copper; Strip #4, which had 1.6 milliequivalents per gram of silicate filler, was also covered, but appeared a little redder as if the initiation of copper deposition was slower. This demonstrates a surprising initiation of electroless copper plating by silicate fillers in the presence of phenols. The other strips remained unchanged during this part of the test.

The copper was then etched off the two strips and the whole panel was adhesion promoted in a solution of chromic acid, sulfuric acid and fluoride to expose more silicate filler particles. The panel was again immersed for about a minute in the electroless copper plating bath the results were the same except that Strip #3, which had 2.5 milliequivalents of aromatic hydroxyl per gram of silicate filler, also began to deposit copper. The panel was left in the electroless plating bath for about half and hour. Strips 3-7 all plated with copper.

Powdered wollastonite poured into a beaker containing the electroless copper plating bath did not plate with copper or form copper deposits on the beaker. Therefore, this surprising catalytic activity results from the combination of the silicate filler with the phenolic resin, and not from the filler alone.

The preferred epoxy glass base materials for manufacture of fully-additive printed wiring boards comprise a catalyst for electroless plating (e.g., U.S. Pat. Nos. 3,546,009; 3,560,257; 3,600,330; 3,629,185; and 4,287,253 which are incorporated herein by reference), silicate fillers, and a phenolic resin curing agent for the epoxy resin. Most preferably, the base materials comprise an excess of 1 to 15% phenolic resin based on the stoichiometric amount needed to cure the epoxy resin. It has been found that initiation of electroless metal deposition in an additive plating solution is 6 to 10 times faster for base materials containing phenolic resin curing agents and 30 to 100 parts of silicate filler per hundred parts of epoxy resin than for prior art epoxy base materials, as described in the above mentioned patents, which were cured with dicyandiamide and precatalyzed with 6 to 12 parts of a clay filler catalyzed with 0.12% by weight palladium.

It also is obvious that epoxy base materials containing silicate fillers and cured with phenolic compounds will initiate faster metal deposition when catalyzed for plating with activator solutions in the standard subtractive or semi-additive processes.

The precatalyzed base materials as described in U.S. Pat. Nos. 3,546,009; 3,560,257; 3,600,330; 3,629,185; and 4,287,253 have not been used for subtractive printed wiring board manufacture. They were only useful for fully-additive printed wiring board manufacture because the catalytic activity was too low for the subtractive manufacturing process. The improved catalytic activity when the base material also incorporates a silicate filler and a stoichiometric excess of a phenolic resin make the precatalyzed base materials of this invention useful for subtractive printed wiring board processing by providing a precatalyzed base material that does not need an activation cycle before plating.

EXAMPLE 2

Copper foils, 35–40 micrometers thick, were electrolessly deposited from an electroless copper plating solution. The capability of the electroless plating solution to deposit ductile copper was determined from the percent elongation of the copper foils which ranged from 3.5 to 7.8% with an average of 6.1%.

For the production of fully-additive printed wiring boards using the electroless copper solution, a CTE along the Z-axis of 100 to 120 ppm was required. To lower the expansion along the Z-axis, 70 parts of silicate filler per hundred parts of resin were added to the base material. A phenolic resin which had an average of seven and at least three aromatic hydroxyl groups per molecule was used as the curing agent for the epoxy resin and to provide a catalyst for electroless metal deposition in conjunction with the silicate filler. The excess of phenolic resin over the stoichiometric equivalent of the epoxy resin was 0.3 milliequivalents of aromatic hydroxyl groups per gram of silicate filler. Palladium catalyzed filler was added as a secondary catalyst. The formulation was:

| | |
|---|---|
| DER 531 TM (Dow Chemical Co.)* | 90 kg (112 kg liquid) |
| DER 331 TM (Bisphenol A diglycidal ether resin available from Dow Chemical Co.) | 10 kg |
| HRJ2190 TM (phenolic resin available from Schenectady Chemicals Inc.) | 28 parts |
| 2-methylimidazole | 0.07 phr |
| Filler, wollastonite (average particle size 10 micrometers surface area 10 sq. meters/gram) | 70 phr |
| Filler, catalytic (0.1% palladium on a kaolin support)** | 12.5 phr |
| KZ 55 TM coupling agent (available from Kenrich Petrochemicals)*** | 1 phr |
| KR 134S TM coupling agent (from Kenrich)**** | 0.2 phr |

*DER 531 TM is a solution of epoxy resins with 80% resin solids, and 19–20% bromine.
**U.S. Pat. No. 4,287,253.
***KZ 55 TM is dihydrogen tetrakis[2,2-bis[(2-propenyloxy)methyl]-1-butanolato-O']bis(ditridecyl phosphito-O") zirconate.
****KR 134S TM is bis[4-(2-phenyl)propyl-2]phenolato, oxoethylenediolato titanium IV.

To manufacture the base material, the coupling agents first were dissolved in a mixture of methyl ethyl ketone and acetone. The filler was dispersed in the coupling agent solution and mixed overnight to thoroughly wet the filler with the coupling agents. The filler and coupling agent solution then were added to a solution of the resins in a mixture of methyl ethyl ketone and acetone to make the impregnating varnish. The surface area of filler was 330 sq. meters/100 grams of the resin/-filler composition.

In a conventional manner woven glass cloth was impregnated with the varnish to make a prepreg, and 9 sheets of the prepreg were laminated together to form base material 1.5 mm thick.

The resulting base material had a $T_g$ of 115° C. and a CTE along the Z-axis from 30°–270° C. of 82 ppm. The surface area of filler was 435 sq. meters/100 grams of the solid resin filler composition. As a comparison, conventional, fully additive, dicyandiamide cured, epoxy glass base material for the fully-additive process, which contains only the 12.5 phr catalytic filler, has a CTE along the Z-axis which averages 220 ppm.

Fully-additive printed wiring boards were formed on the base material by standard procedures. The "take time" (the elapsed time before the initial copper deposit could be observed on the hole walls) in a production electroless copper plating tank was one hour. The "take time", in the same solution, for the conventional, fully additive, dicyandiamide cured, epoxy glass laminates containing a 12.5 phr palladium catalyzed filler was four hours. The printed wiring boards were thermal stress tested and passed five consecutive thermal stress tests with no cracks in the copper plating on the hole walls.

EXAMPLE 3

An epoxy glass laminate precatalyzed for electroless copper deposition was prepared using a calcium silicate and a phenolic resin as the first catalyst and a palladium catalyzed clay as the second catalyst. The stoichiometric excess of phenolic resin over the epoxy resin was 0.8 milliequivalents of aromatic hydroxyl per gram of calcium silicate. Another epoxy glass laminate was prepared as a control without the first catalyst, but twice the concentration of the second catalyst, palladium catalyzed clay. The formulations were:

| | | |
|---|---|---|
| DER 531 TM epoxy resin | 75.6 g | 100.0 g |
| HRJ 2190 TM phenolic resin | 24.4 g | — |
| Dicyandiamide | — | 3.0 g |
| 2-methylimidazole | 0.1 g | 0.1 g |
| Wollastonite (calcium silicate) | 70.0 g | — |
| Clay catalyzed with 1% Pd* | 6.0 g | 12.5 g |
| KZ 55 TM coupling agent | 1.0 g | — |
| KZ 134S TM coupling agent | 0.2 g | — |
| Methyl ethyl ketone/acetone | 25 g | 25 g |

*U.S. Pat. No. 3,600,330

The two laminates were prepared by the following procedure. The resins, dissolved in methyl ethyl ketone-/acetone as solvent, were mixed with 2-methylimidazole and coupling agents for a few minutes. The catalyzed clay and wollastonite were added to the resin solutions and mixed with the resin solutions for 5 minutes. The mixtures were allowed to degas to remove entrained air for at least thirty minutes. Additional acetone was added to adjust the viscosity. Prepregs were formed by impregnating 7628 glass cloth and drying at 160° C. for 3 minutes. Nine prepreg layers were laid up and laminated together in a press first at 140° C. and 475 kPa (69 psi) for four minutes, followed by raising the temperature to 160° C. and the pressure to 3600 kPa (520 psi) and maintaining temperature and pressure for 1 hour. After removal from the press, the laminates were post cured for two hours at 180° C. The epoxy glass laminates were coated with a precatalyzed nitrile rubber/resin coating which was hardened at 160° C. Holes were drilled in the laminates. A resist image was applied leaving the nitrile rubber/resin coating exposed in the conductive pattern of an additive printed wiring board. The pattern was adhesion promoted and plated in a production electroless copper bath. The "take time" for the through holes in the laminate with 12.5 phr palladium catalyzed clay filler was four hours, while the "take time" for the laminate catalyzed with calcium silicate filler and phenolic resin as a first catalyst and 6 phr palladium catalyzed clay filler as a second catalyst was one hour.

EXAMPLE 4

Following the procedures of Example 3, a base material is prepared with the following formulation:

| DER 531 TM epoxy resin | 92 kg (73.6 kg solids) |
| --- | --- |
| Epoxy Resin XB 4383 TM (Ciba-Geigy Corp.)* | 25 kg (18.75 kg solids) |
| Cresol novolac epoxy resin | 8 kg |
| HRJ 2190 TM phenolic resin | 33 kg |
| 2-methylimidazole | 0.2 phr |
| Filler, wollastonite | 70 phr |
| Filler, kaolin with 1% Pd** | 12.5 phr |
| KZ 55 TM coupling agent | 1 phr |
| KR 134S TM coupling agent | 0.2 phr |

*XB 4383 TM is a solution containing 75% of a brominated bisphenol A epoxy resin.
**U.S. Pat. No. 3,600,330.

Fully-additive printed wiring boards are formed by providing the base material with a nitrile rubber/resin coating, drilling through holes, forming a resist image, adhesion promoting and electrolessly plating with copper. Take time is less than 40 minutes. Copper plating is continued until the fully-additive printed wiring boards have conductive patterns and plated-through holes with a copper deposit 36 to 40 micrometers thick. The electroless copper plating solution deposits copper which has an elastic limit of 1.8% at 36 to 40 micrometers thickness.

The printed wiring boards are thermal stress tested by four cycles on molten solder at 288° C. All the boards pass with no cracks in the holes.

A sample of the base material is dried at 140° C., weighed, immersed in water at 82° C. for 17 hours and reweighed to determine the water absorbed at 82° C. A conventional additive base material is used as a control. The water absorption is 0.50% less than the water absorption of the control. The filler in the control additive base material is 12 phr catalytic filler, and it does not contain the titanate and zirconate coupling agents to enhance water resistance of the base material.

EXAMPLE 5

Prepregs are prepared as in Example 4 and a press layup for a precatalyzed subtractive laminate is prepared in a conventional manner with 8 sheets of the prepreg and with copper foil as the outer layers. These are laminated together to form base material 1.6 mm thick. Through holes are drilled in the laminate. The laminate is cleaned, and, without activation, immersed in a high speed electroless copper plating bath. After ten minutes immersion, the holes are completely coated with copper. The laminate is then electroplated, imaged and etched to form a plated-through hole printed wiring board.

EXAMPLE 6

A printed wiring base material 1.5 mm thick was prepared using the following formulation which has a phenolic resin with aromatic hydroxyl groups as the curing agent:

| Dow 531 TM epoxy resin | 100 parts |
| --- | --- |
| HRJ 1152 TM (phenolic resin available from Schenectady Chemicals Inc.) | 28 parts |
| 2-methylimidazole | 0.02 phr |

-continued

| Filler, wollastonite | 70 phr |
| --- | --- |
| Filler, kaolin with 0.1% Pd* | 12.5 phr |
| KZ 55 TM coupling agent | 1 phr |
| KR 134S TM coupling agent | 0.2 phr |

*U.S. Pat. No. 3,600,330

The base material had a $T_g$ of 102° C. and a CTE along the Z-axis of 134 ppm.

Fully-additive printed wiring boards formed on the base material were plated in an electroless copper solution which formed deposits with 4–7% elongation at 36–40 micrometers thickness. The "take time" for this base material in the electroless plating solution was one half hour, one-eighth as long as conventional fully-additive base materials which are cured with dicyandiamide and have as filler only 12.5% kaolin catalyzed with 0.1% palladium. This demonstrates the improved catalytic activity for electroless plating of base materials having silicate fillers and a stoichiometric excess of phenolic hydroxyl groups.

EXAMPLE 7

A prepreg was prepared with the following formulation:

| Quatrex 5010 TM (resin solids)* | 100 parts |
| --- | --- |
| Filler, wollastonite | 40 phr |
| Filler, kaolin with 0.1% Pd** | 10 phr |
| KZ 55 TM coupling agent | 1 phr |
| KR 134S TM coupling agent | 0.2 phr |

*Quatrex 5010 TM is a one-component epoxy resin system containing a non-dicyandiamide hardener which is designated as a high $T_g$ system for printed wiring board base materials. It is believed to be a tris(hydroxyphenyl)methane triglycidyl ether resin, and a hardener which is the product of a solution of hexa(methoxymethyl)-melamine and bisphenol A reacted together at 145° C. in the presence of an oxalic acid catalyst.
**U.S. Pat. No. 3,600,330.

Nine sheets of the prepreg were laminated together form a base material 1.5 mm thick which had a $T_g$ of 150° C. and a CTE along the Z-axis from 30° to 270° C. of 132 ppm.

Fully-additive printed wiring boards were formed on the base material and cycled four times through the thermal stress test. All the boards passed the tests with no cracks observed in the metal on the hole walls.

EXAMPLE 8

A multilayer laminate is prepared using the formulation of Example 4. Prepregs are prepared by impregnating type 7628 woven glass cloth with the varnish. Four layers of prepreg plus outer layers of copper foil are laminated together. The outer layers of copper foil are printed and etched to form conductive layers corresponding to a ground plane and a voltage plane. Two additional layers of prepreg are laminated over both the ground plane and the voltage plane. The CTE of the finished laminate along the Z-axis from 30° to 270° C. is less than $140 \times 10^{-6}$/°C. A nitrile rubber/resin coating is applied to the outer surfaces, through holes are drilled and a multilayer printed wiring board with plated-through holes is formed from the laminate by the fully additive process. The plated-through holes are resistant to failure by thermal stress and thermal cycling.

EXAMPLE 9

A laminate was prepared using nine sheets of prepreg impregnated with the following varnish:

| | |
|---|---|
| Epoxy resin solution* | 125 kg (1 kg solids) |
| Kaolin** | 64 kg |
| Catalyzed filler with 0.1% Pd*** | 6 kg |
| Coupling Agent (KZ-55 ™) | 1 kg |
| Coupling Agent (KR-134S ™) | 70 g |
| 2-Methylimidazole | 0.45 kg |
| Acetone | 80 kg |

*A mixture of 200 g phenolic hardener, XU 71817 ™, and 800 g epoxy resin, DER 383 ™, from Dow Chemical Company as an 80% solids solution in acetone.
**Average particle size 1.5 micrometers.
***The catalytic filler was prepared according to U.S. Pat. No. 4,287,253, and the kaolin support had an average particle size of 0.6 micrometers and a surface area of 15-20 sq. meters/gram.

The laminate had an a glass transition temperature, $T_g$, of 125° C. and an average coefficient of thermal expansion from 30° C. to 270° C. of $74 \times 10^{-6}$/°C.

Through holes in this laminate had a take time of about ninety minutes in the production additive plating bath.

What is claimed is:

1. In a method of manufacturing fully-additive printed wiring boards by electrolessly plating copper on precatalyzed base material, the base material containing a polymeric resin, woven glass cloth reinforcement and a palladium catalyzed clay filler to render the base material catalytic throughout for electrolessly depositing copper without an activation step, the improvement comprising:

providing in the polymeric resin a phenolic resin component and a silicate filler, said silicate filler being between 30 and 100 parts per hundred parts of the polymeric resin, and being present in an amount sufficient to initiate electroless copper deposition at least four times faster than initiation on precatalyzed base material without said silicate filler and phenolic resin.

2. A method according to claim 1 wherein the polymeric resin is an epoxy resin, and the phenolic resin component is a curing agent for the epoxy resin, the phenolic resin being present in an amount that provides between 1% and 50% stoichiometric excess of aromatic hydroxyl groups over the epoxide groups.

3. A method according to claim 1 wherein the polymeric resin is an epoxy resin and the phenolic resin is selected from the group consisting of aldehyde condensation polymers with phenol, alkyl phenol, cresol and xylenol, and the noble metal catalyst is palladium, the palladium being present in an amount of 0.0005 to 0.05 parts palladium per hundred parts epoxy plus phenolic resin.

4. A method according to claim 1 wherein the polymeric resin is an epoxy resin, and the phenolic resin component is a curing agent for the epoxy resin, the phenolic resin being present in a 1-15% excess based on the stoichiometric amount needed to cure the epoxy resin.

5. In a method of manufacturing fully-additive printed wiring boards by electrolessly plating copper on precatalyzed base material, the base material containing a polymeric resin, woven glass cloth reinforcement and a palladium catalyzed clay filler, said palladium catalyzed clay filler dispersed sufficiently throughout the base material to render the base material catalytic throughout for electrolessly depositing copper without an activation step, the improvement comprising:

providing in the polymeric resin a phenolic resin component, said phenolic resin component having aromatic hydroxyl substituents, and a silicate filler, said silicate filler being between 30 and 100 parts per hundred parts of the polymeric resin, and being present in an amount sufficient to initiate electroless copper deposition at least four times faster than initiation on precatalyzed base material without said silicate filler and phenolic resin.

6. A method according to claim 5 wherein said phenolic resin having an aromatic hydroxyl substituent is present in the range of 0.1 to 10 milliequivalents of aromatic hydroxyl per gram of silicate filler.

7. A method according to claim 6 wherein said phenolic resin having an aromatic hydroxyl substituent is present in the range of 0.1 to 5 milliequivalents of aromatic hydroxyl per gram of silicate filler.

8. A method according to claim 7 wherein said phenolic resin having an aromatic hydroxyl substituent is present in the range of 0.5 to 2 milliequivalents of aromatic hydroxyl per gram of silicate filler.

* * * * *